US007816277B2

(12) United States Patent
Hiruma et al.

(10) Patent No.: US 7,816,277 B2

(45) Date of Patent: Oct. 19, 2010

(54) METHOD FOR FORMING DEPOSIT, DROPLET EJECTION APPARATUS, ELECTRO-OPTIC DEVICE, AND LIQUID CRYSTAL DISPLAY

(75) Inventors: Kei Hiruma, Chino (JP); Osamu Kasuga, Suwa (JP); Yuji Iwata, Suwa (JP)

(73) Assignee: Seiko Epson Corporation (JP)

( * ) Notice: Subject to any disclaimer, the term of this patent is extended or adjusted under 35 U.S.C. 154(b) by 664 days.

(21) Appl. No.: 11/705,270

(22) Filed: Feb. 12, 2007

(65) Prior Publication Data

US 2007/0188534 A1 Aug. 16, 2007

(30) Foreign Application Priority Data

Feb. 13, 2006 (JP) ............................ 2006-034776
Jan. 10, 2007 (JP) ............................ 2007-002302

(51) Int. Cl.
*H01L 21/31* (2006.01)
*H01L 21/469* (2006.01)
*H01L 21/44* (2006.01)

(52) U.S. Cl. ............... 438/758; 438/613; 257/E21.174; 257/E21.508

(58) Field of Classification Search .................. 438/21, 438/613, 758; 347/1, 20, 47; 257/E21.174, 257/E21.508, E21.515, E21.519
See application file for complete search history.

(56) References Cited

U.S. PATENT DOCUMENTS 7,604,848 B2 * 10/2009 Iwata ......................... 427/542
2006/0214993 A1 * 9/2006 Iwata .......................... 347/52

FOREIGN PATENT DOCUMENTS

JP 2005-053186 3/2005
JP 2005-131498 5/2005
JP 2005-296854 10/2005

* cited by examiner

*Primary Examiner*—Walter L Lindsay, Jr.
(74) *Attorney, Agent, or Firm*—Harness, Dickey & Pierce, P.L.C.

(57) ABSTRACT

A deposit forming method including ejecting droplets of a deposit forming material onto a substrate, thereby forming a deposit by the droplets on the substrate, is provided. The droplets are ejected along a direction inclined at a predetermined angle in a predetermined direction with respect to a normal line of the substrate and at a predetermined pitch in the predetermined direction. The predetermined angle is set in correspondence with the diameter of each of the droplets and the predetermined pitch in such a manner that the dimension of a dot formed by each droplet on the substrate in the predetermined direction becomes greater than or equal to the predetermined pitch.

3 Claims, 6 Drawing Sheets

Fig.10 (Comparative example)
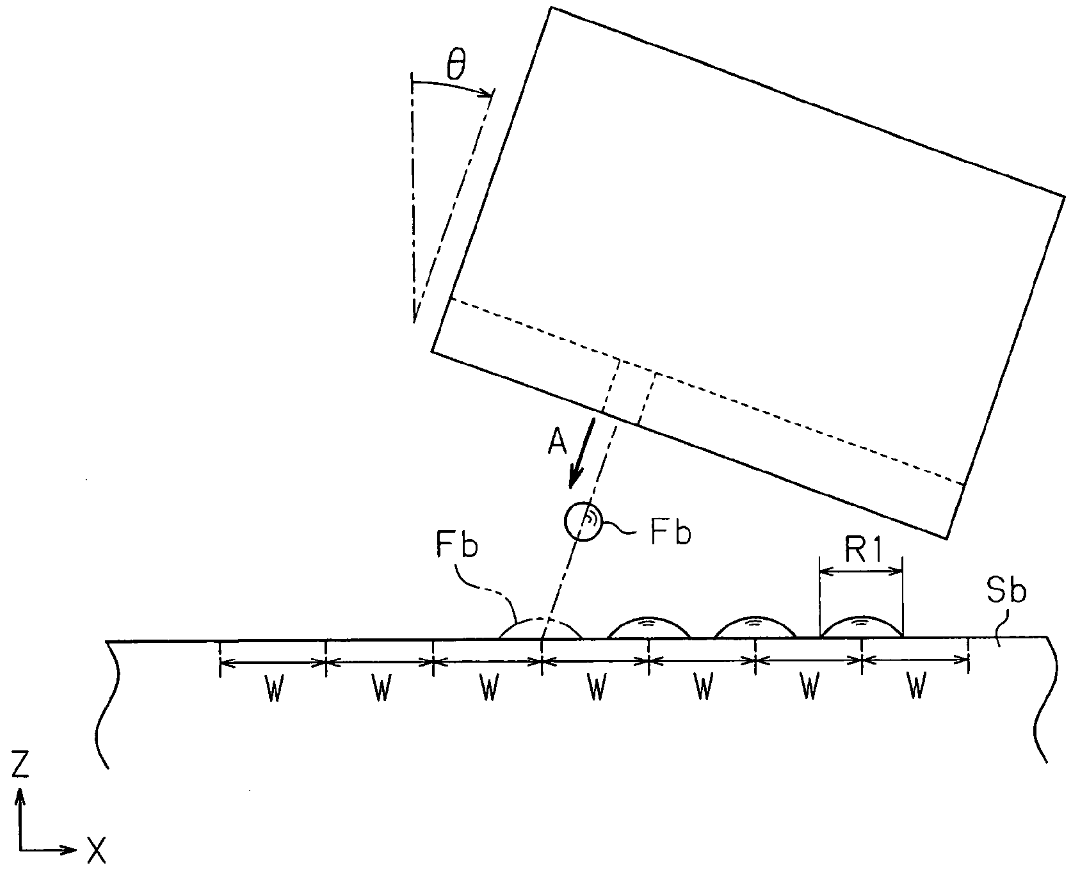

METHOD FOR FORMING DEPOSIT, DROPLET EJECTION APPARATUS, ELECTRO-OPTIC DEVICE, AND LIQUID CRYSTAL DISPLAY

CROSS-REFERENCE TO RELATED APPLICATIONS

This application is based upon and claims the benefit of priority from prior Japanese Patent Application No. 2006-034776, filed on Feb. 13, 2006 and Japanese Patent Application No. 2007-002302, filed on Jan. 10, 2007, the entire contents of which are incorporated herein by reference.

BACKGROUND

1. Technical Field

The present invention relates to a method for forming a deposit, a droplet ejection apparatus, an electro-optic device, and a liquid crystal display.

2. Related Art

A procedure for manufacturing a display or a semiconductor device includes a number of steps of forming a patterned film. Specifically, the patterned film is formed by depositing a film on a substrate and subjecting the film to patterning in a predetermined shape.

To improve productivity, this type of process for forming a patterned film now employs an inkjet method. In the method, a patterned film is formed by ejecting droplets of liquid onto a substrate and solidifying the droplets on the substrate. The patterned film is thus formed on the substrate in correspondence with the shapes of the droplets. This makes it unnecessary to form a mask for patterning, thus decreasing the number of the steps for forming the patterned film.

However, in formation of the patterned film by the inkjet method, some of the ejected droplets may not spread wet and form recesses and projections on the surface of the substrate. The patterned film reflects the recesses and projections, thus causing unevenness in the patterned film or non-uniform thicknesses of the patterned film.

To solve this problem, a method for promoting wet spreading of the droplets on the surface of the substrate has been proposed. As described in JP-A-2005-131498, droplets of liquid are ejected in a direction inclined with respect to a normal line of a substrate. This provides a velocity component in a direction along tangential line of the substrate to each of the ejected droplets. The droplets thus effectively spread wet along the surface of the substrate at an angle (an inclination angle) defined by the normal direction of the substrate and the ejecting direction of the droplets.

To change the thickness of the patterned film formed by the inkjet method, or to change the total ejection amount per unit area, the ejection pitch of the droplets, normally, is altered while the volume of each droplet is maintained at a constant value. For example, to form a patterned film having a relatively small thickness, the volume of each droplet is maintained constant. However, the ejection pitch of the droplets is increased by raising the scanning speed of the substrate with respect to the nozzles or prolonging the operation cycle of ejection. This stabilizes ejection of the droplets, ensuring reproducibility of the total ejection amount, or reproducibility of the thickness of the patterned film.

However, the technique of JP-A-2005-131498 addresses only to offset traveling and splash of ejected droplets. The inclination angle of the ejecting direction is selected from a relatively large range. Therefore, as illustrated in FIG. 10, if the inclination angle θ of the ejecting direction A is excessively small when forming a patterned film with a relatively small thickness by increasing the ejection pitch W of the droplets Fb, the on-substrate size R1 of each droplet Fb on the substrate becomes smaller than the ejection pitch W of the droplets Fb. Thus, the droplets Fb are scattered on the substrate.

As a result, unevenness of the droplets Fb is reflected in the shape of the obtained patterned film, causing significant non-uniformity in the thickness of the patterned film.

SUMMARY

An advantage of some aspects of the present invention is to provide a method for forming a deposit and a droplet ejection apparatus that improve uniformity of the thickness of a deposit, such as a patterned film, formed by droplets. Another objective of some aspects of the invention is to provide an electro-optic device and a liquid crystal display that have a deposit formed using the droplet ejection apparatus.

In accordance with a first aspect of the present invention, a deposit forming method including ejecting droplets of a deposit forming material onto a substrate, thereby forming a deposit by the droplets on the substrate, is provided. The droplets are ejected along a direction inclined at a predetermined angle in a predetermined direction with respect to a normal line of the substrate and at a predetermined pitch in the predetermined direction. The predetermined angle is set in correspondence with the diameter of each of the droplets and the predetermined pitch in such a manner that the dimension of a dot formed by each droplet on the substrate in the predetermined direction becomes greater than or equal to the predetermined pitch.

In accordance with a second aspect of the present invention, a droplet ejection apparatus that ejects droplets of a deposit forming material onto a substrate for forming a deposit by the droplets on the substrate is provided. The droplets are ejected along a direction inclined at a predetermined angle in a predetermined direction with respect to a normal line of the substrate and at a predetermined pitch in the predetermined direction. The apparatus includes an ejection port forming surface, a tilt mechanism, and an angle setting section. The ejection port forming surface is opposed to the substrate. A plurality of linearly arranged ejection ports through which the droplets are ejected are formed in the ejection port forming surface. The tilt mechanism tilts the ejection port forming surface about a tilt axis extending parallel with the direction in which the ejection ports are arranged. The an angle setting section sets the predetermined angle by controlling operation of the tilt mechanism in correspondence with the diameter of each of the droplets and the predetermined pitch in such a manner that the dimension of a dot formed by each of the droplets on the substrate in the predetermined direction becomes greater than or equal to the predetermined pitch.

In accordance with a third aspect of the present invention, an electro-optic device is provided that includes a substrate on which a deposit has been formed using the apparatus according to the above described second aspect of the present invention.

In accordance with a fourth aspect of the present invention, a liquid crystal display is provided that includes a substrate on which an alignment film has been formed using the device according to the above described second aspect of the present invention.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 10 is a side view schematically showing a droplet ejection apparatus of a comparative example of the present invention.

DESCRIPTION OF EXEMPLARY EMBODIMENTS

Figure 1:
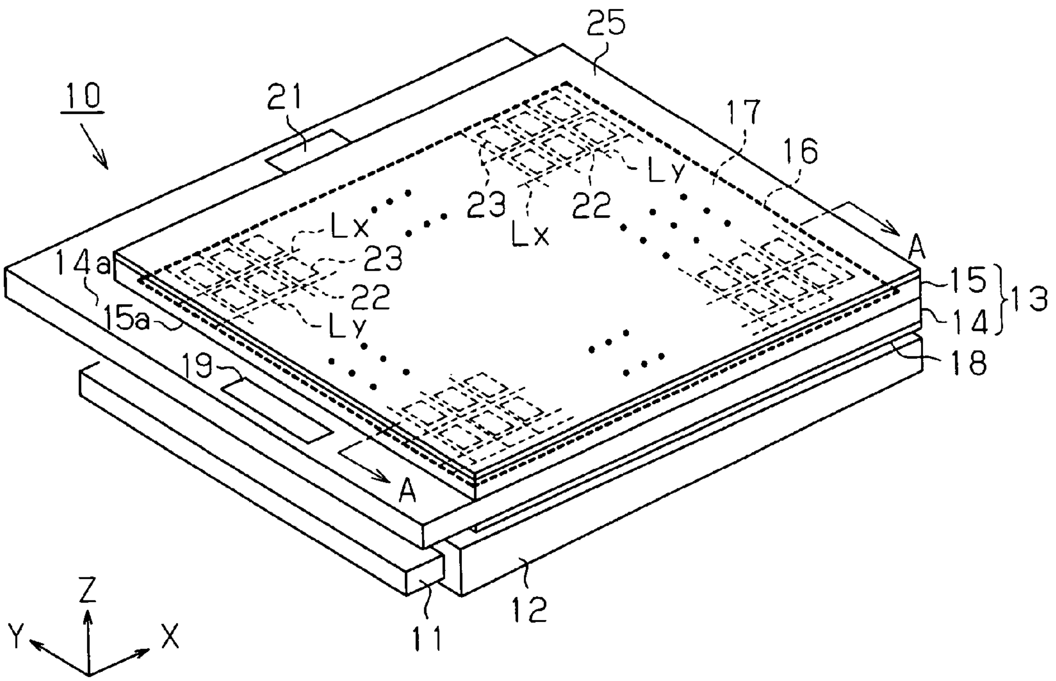
FIG. 1 is a perspective view showing a liquid crystal display according to one embodiment of the present invention.
Figure 2:
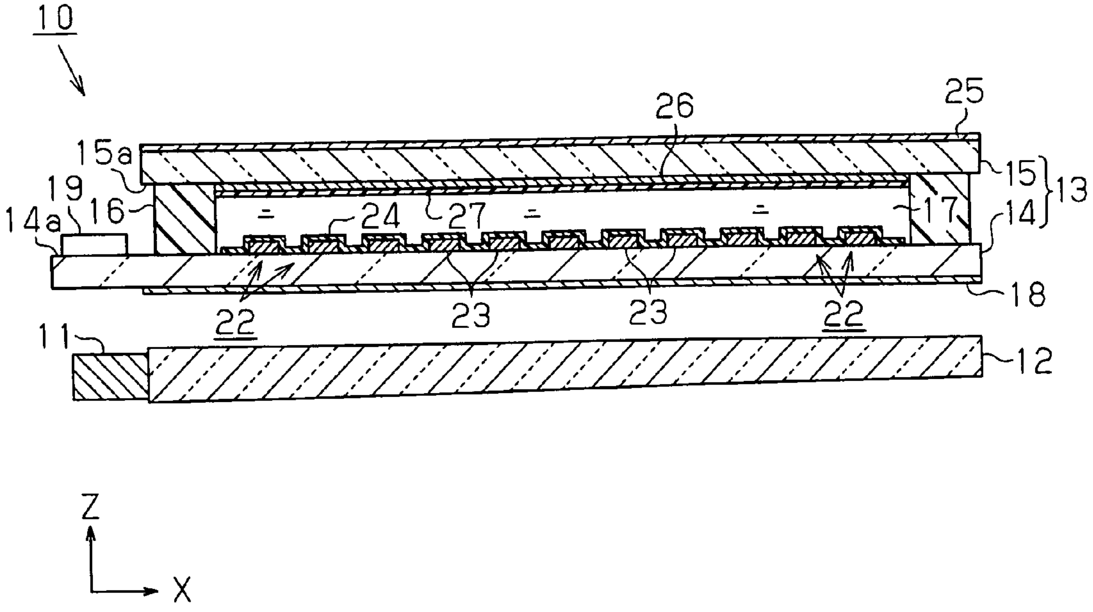
FIG. 2 is a cross-sectional view illustrating the liquid crystal display of FIG. 1.

An embodiment of the present invention will now be described with reference to FIGS. 1 to 9. First, a liquid crystal display 10, or an electro-optic device, will be explained. The liquid crystal display 10 has an alignment film 27, or a deposit, formed by a method for forming a deposit according to the present invention. FIG. 1 is a perspective view showing the liquid crystal display 10 and FIG. 2 is a cross-sectional view taken along line A-A of FIG. 1.

As shown in FIG. 1, the liquid crystal display 10 has an edge light type backlight 12, which is shaped like a rectangular plate and has a light source 11 such as an LED. The backlight 12 is arranged in a lower portion of the liquid crystal display 10.

A liquid crystal panel 13, which is shaped like a rectangular plate and sized substantially equal to the size of the backlight 12, is provided above the backlight 12. The light emitted by the light source 11 is radiated onto the liquid crystal panel 13.

The liquid crystal panel 13 has an element substrate 14 and an opposed substrate 15 opposed to the element substrate 14. Referring to FIG. 2, the element substrate 14 and the opposed substrate 15 are bonded together through a seal material 16 having a rectangular frame-like shape and formed of light curing resin. Liquid crystal 17 is sealed in the space between the element substrate 14 and the opposed substrate 15.

An optical substrate 18, such as a polarizing plate or a phase difference plate, is bonded with the lower surface, or the surface facing the backlight 12, of the element substrate 14. The optical substrate 18 linearly polarizes the light of the backlight 12 and emits the light onto the liquid crystal 17. A plurality of scanning lines Lx, which extend in one direction, or direction X, are aligned on the upper surface (an element formation surface 14*a*), or the surface facing the opposed substrate 15, of the element substrate 14. Each of the scanning lines Lx is electrically connected to a scanning line driver circuit 19 provided on the element substrate 14. A scanning signal generated by the scanning line driver circuit 19 is input to the scanning lines Lx at a predetermined timing. A plurality of data lines Ly extending in direction Y are also aligned on the element formation surface 14*a*. Each of the data lines Ly is electrically connected to a data line driver circuit 21 formed on the element substrate 14. The data line driver circuit 21 inputs a data signal generated in accordance with display data to the data lines Ly at a predetermined timing.

A pixel 22 is formed in each of the portions defined on the element formation surface 14*a* by the scanning lines Lx and the data lines Ly, which intersect the scanning lines Lx. In other words, a plurality of pixels 22 are arranged on the element formation surface 14*a* in a matrix-like manner. A non-illustrated control element such as a TFT or a light transmissible pixel electrode 23 formed by a transparent conductive film is provided in each of the pixels 22.

Figure 6:
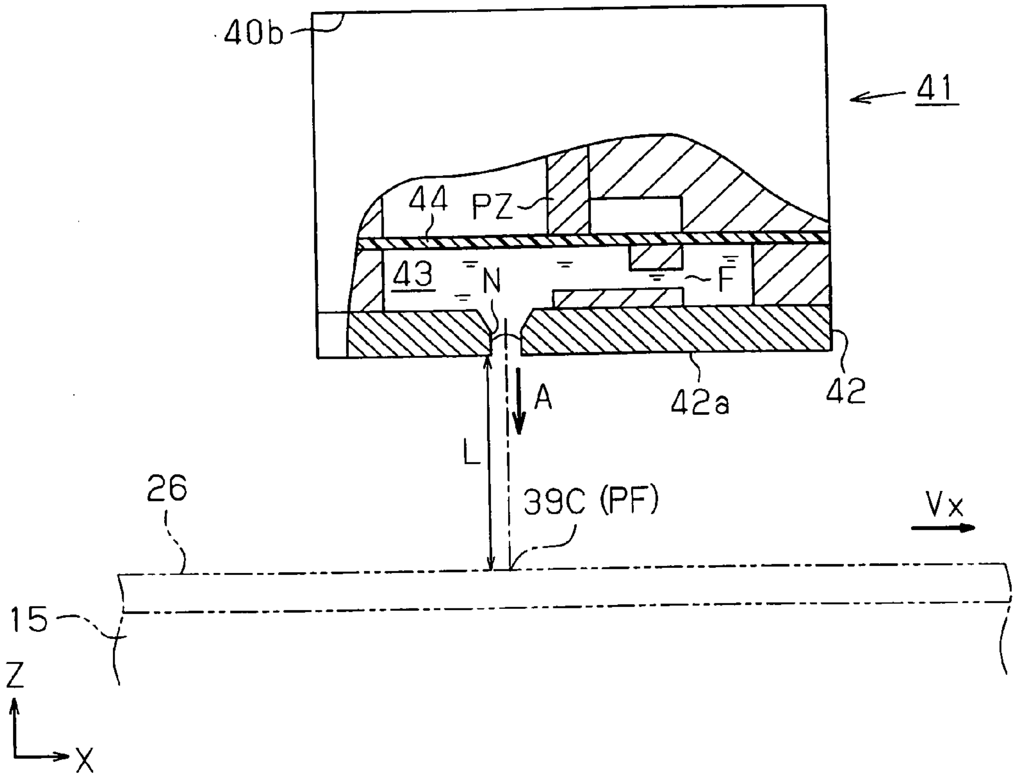
Figure 7:
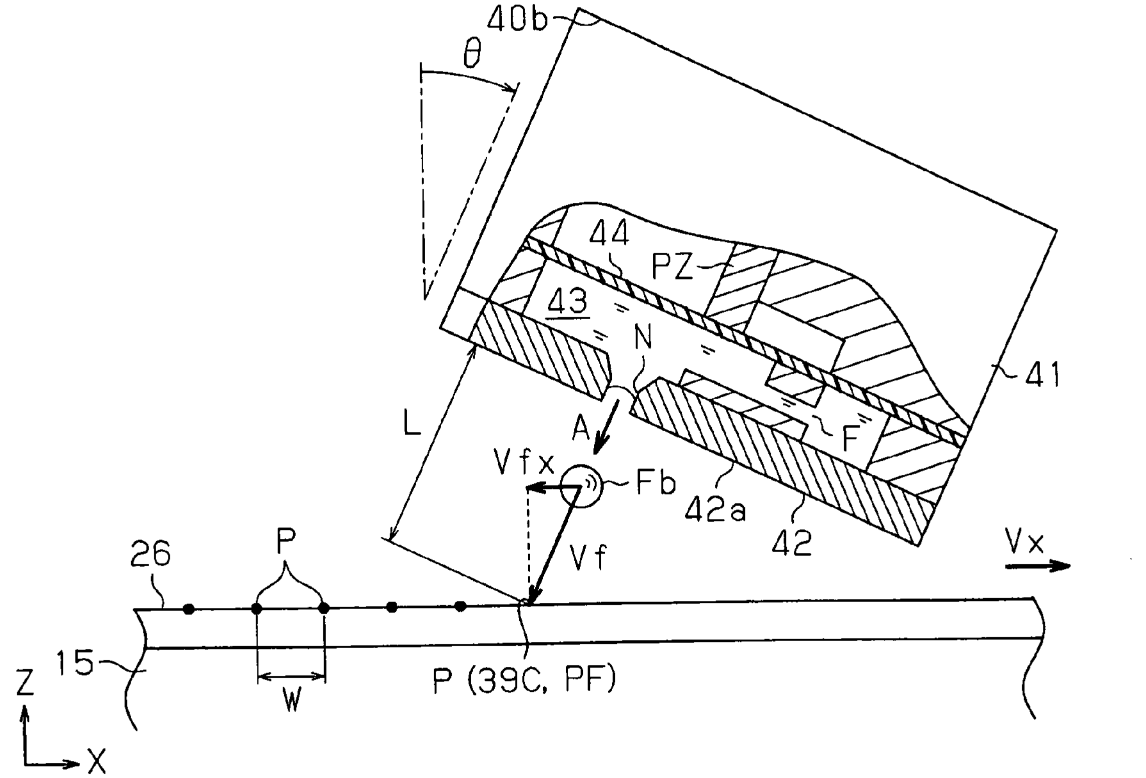
Figure 8:
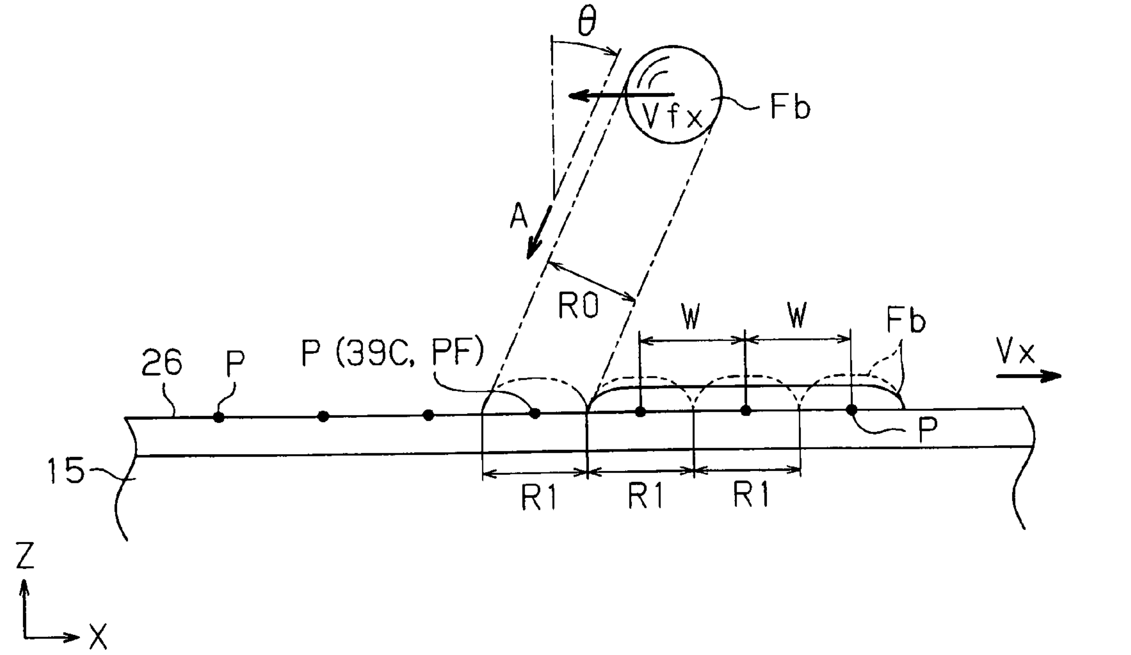
FIG. 8 is a view for explaining droplet ejection by the droplet ejection apparatus of FIG. 3.

As shown in FIG. 2, an alignment film 24 is deposited on the pixels 22. The alignment film 24 has been subjected to an orientation process through, for example, rubbing. The alignment film 24 is formed of alignment polymers such as alignment polyimide and sets the liquid crystals 17 in a prescribed alignment state in the vicinity of the pixel electrodes 23. The alignment film 24 is formed by the inkjet method. Specifically, deposit forming material prepared by dissolving the alignment polymers in a prescribed solvent, which is alignment film forming material F (see FIG. 6), is ejected onto the pixels 22 as droplets Fb (FIG. 7). The droplets Fb are then dried to form the alignment film 24.

A polarizing plate 25 is provided on the opposed substrate 15 and sends linear-polarized light proceeding perpendicularly to the light that has transmitted through the optical substrate 18 in an outward direction, or an upward direction as viewed in FIG. 2. An opposed electrode 26 is arranged on the entire portion of the lower surface (an electrode formation surface 15*a*), or the surface facing the element substrate 14, of the opposed substrate 15. The opposed electrode 26 is formed by a light transmissible conductive film and opposed to the pixel electrode 23. The opposed electrode 26 is electrically connected to the data line driver circuit 21 and receives a predetermined level of common potential from the data line driver circuit 21. An alignment film 27 is arranged on the entire portion of the lower surface of the opposed electrode 26. The alignment film 27 has been subjected to orientation procedure through, for example, rubbing. Like the alignment film 24, the alignment film 27 is formed using the inkjet method. The alignment film 27 sets the liquid crystal 17 in a prescribed alignment state in the vicinity of the opposed electrode 26.

In accordance with line progressive scanning, the scanning lines Lx are selected one by one at predetermined time intervals. The control element of the corresponding one of the pixels 22 is thus turned on for the period in which the scanning line Lx is selected. Respondingly, a data signal, which is generated in accordance with the display data, is input to the pixel electrode 23 corresponding to the control element through the corresponding one of the data lines Ly. This changes the difference between the potential of the pixel electrode 23 and the potential of the opposed electrode 26 in correspondence with the data signal. The alignment state of the liquid crystal 17 between the pixel electrode 23 and the opposed electrode 26 is thus altered. In other words, the polarized state of the light exiting the optical substrate 18 varies for the respective pixels 22 in correspondence with the data signals. Therefore, transmission of the light through the polarizing plate 25 is selectively permitted and prohibited for the respective pixels 22. This displays an image on the upper side of the liquid crystal panel 13 in accordance with the display data.

A droplet ejection apparatus 30, by which the alignment film 27 (the alignment film 24) is formed, will hereafter be explained with reference to FIGS. 3 to 9.

Figure 3:
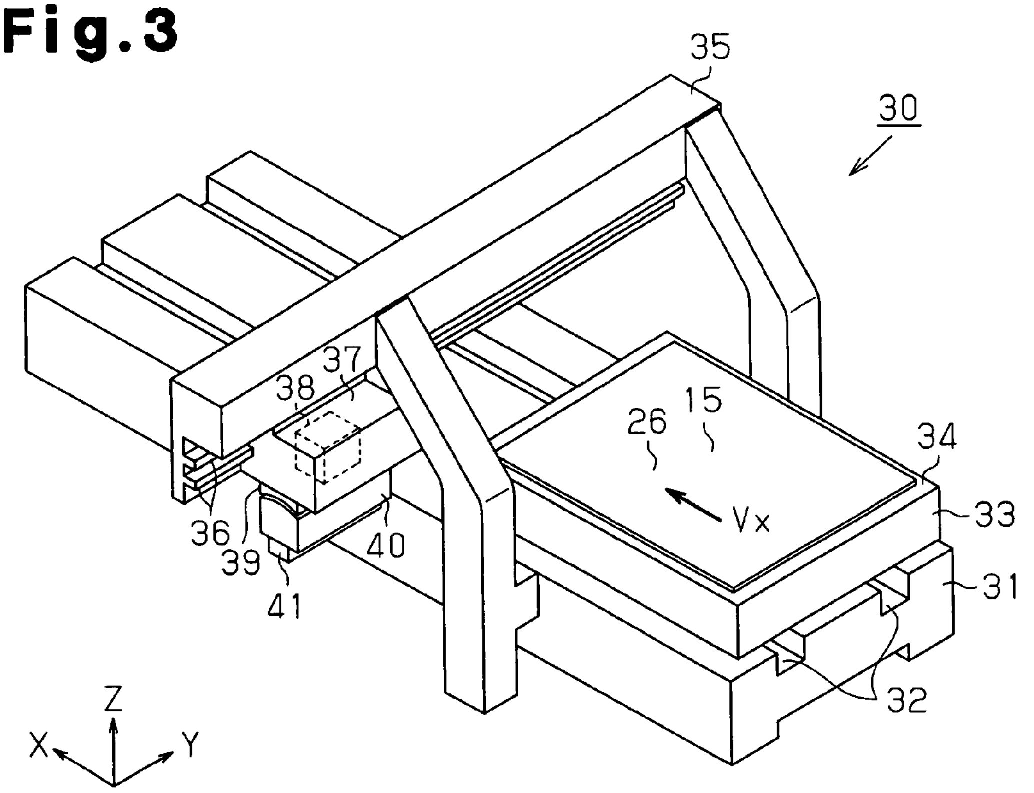
FIG. 3 is a cross-sectional view illustrating a droplet ejection apparatus according to the embodiment.

As shown in FIG. 3, the droplet ejection apparatus 30, which is an apparatus for forming an alignment film in the illustrated embodiment, has a rectangular parallelepiped base 31. A pair of guide grooves 32 are defined in the upper surface of the base 31 and extend in the longitudinal direction of the base 31, or direction X. A substrate stage 33, which functions as a movement mechanism, is provided on the base 31 and operationally connected to the output shaft of an X-axis motor MX (see FIG. 9), which is arranged in the base 31. The substrate stage 33 moves along the guide grooves 32, or in direction X, at a predetermined velocity (transport velocity Vx).

The upper surface of the substrate stage 33 functions as a mounting surface 34 on which the opposed substrate 15 can be mounted. The mounting surface 34 positions and fixes the opposed substrate 15 with respect to the substrate stage 33. The opposed substrate 15 is mounted on the mounting surface 34 with the opposed electrode 26 facing upward. Although the opposed substrate 15 is mounted on the mounting surface 34 in the illustrated embodiment, the element substrate 14 may be mounted on the mounting surface 34 with the pixel electrodes 23 facing upward.

A gate-shaped guide member 35 straddles the base 31 and extends in direction Y. A pair of upper and lower guide rails 36 are formed in the guide member 35, extending in direction Y.

A carriage 37 is provided in the guide member 35 and operationally connected to the output shaft of a Y-axis motor MY (see FIG. 9), which is also arranged in the guide member 35. The carriage 37 moves in direction Y and the direction opposed to direction Y along the guide rails 36. An ink tank 38 is mounted in the carriage 37 and retains the alignment film forming material F (see FIG. 6). The alignment film forming material F can be sent from the ink tank 38 to a droplet ejection head 41, which is arranged on the lower surface of the carriage 37.

Figure 4:
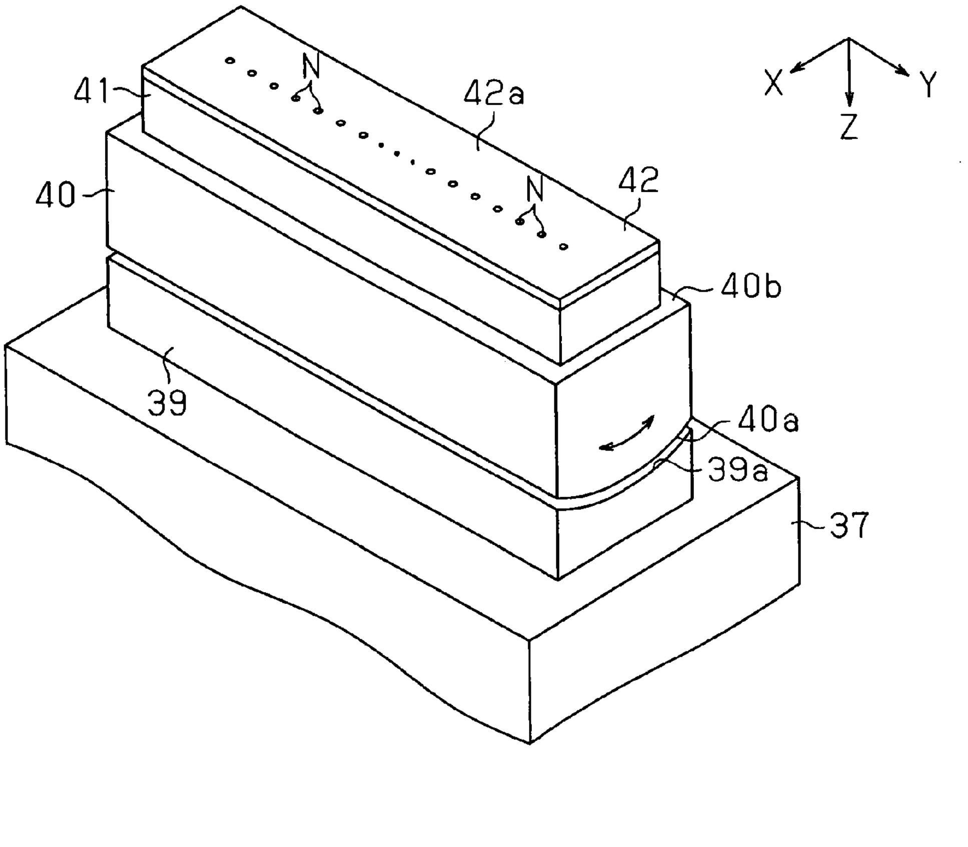
FIG. 4 is a cross-sectional view illustrating a droplet ejection head of the droplet ejection apparatus of FIG. 3.
Figure 5:
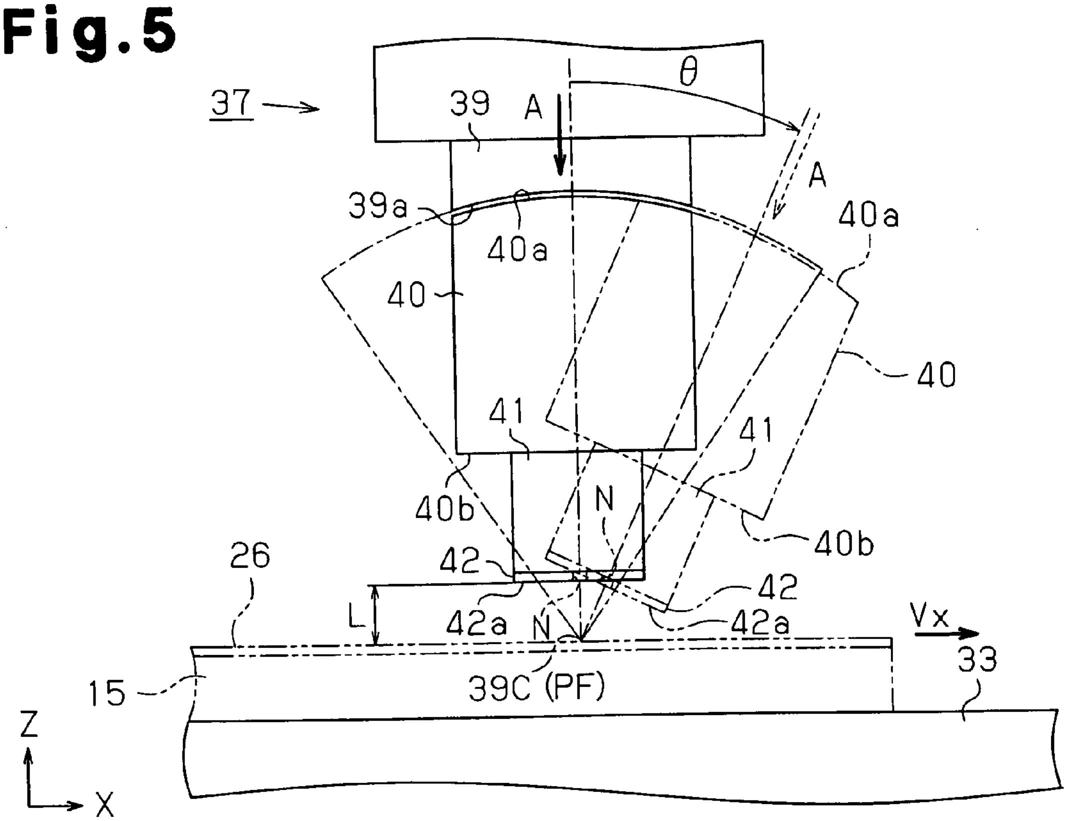
FIGS. 5, 6 and 7 are side views illustrating the droplet ejection head.

FIG. 4 is a perspective view schematically showing the carriage 37 (the droplet ejection head 41) from below (from the side corresponding to the opposed substrate 15). FIGS. 5 and 6 are side views schematically showing the carriage 37 and the droplet ejection head 41 as viewed in direction Y.

As shown in FIG. 4, a guide stage 39, which has a rectangular parallelepiped shape and extends in direction Y, is arranged below (above, as viewed in FIG. 4) the carriage 37. A recessed curved surface (a guide surface 39*a*) having an arcuate cross section is formed on the lower surface (the upper surface, as viewed in FIG. 4) of the guide stage 39. The guide surface 39*a* extends along substantially the entire width of the guide stage 39 in direction Y. The center of curvature 39C (see FIG. 5, to the lower center) of the guide surface 39*a* is located at a position immediately below the guide stage 39 and on the upper surface of the opposed electrode 26 mounted on the substrate stage 33.

Referring to FIG. 4, a tilt stage 40 shaped as an inverted U projecting body and extending in direction Y, which forms a tilt mechanism, is provided along the guide stage 39. A projecting curved surface (a slidable surface 40*a*) shaped in correspondence with the guide surface 39*a* is formed on the side surface (the lower surface as viewed in the drawing) of the tilt stage 40 closer to the guide stage 39. A flat surface (a securing surface 40*b*) extending parallel with the opposed substrate 15 is formed on the opposing side surface (the upper surface as viewed in FIG. 4) of the tilt stage 40 opposed to the slidable surface 40*a*.

The tilt stage 40 is operationally connected to the output shaft of a tilt motor MR (see FIG. 9, to the upper right), which is housed in the carriage 37. When the tilt stage 40 is powered by the tilt motor MR, the slidable surface 40*a* slides (pivots) along the guide surface 39*a*. Specifically, the securing surface 40*b* of the tilt stage 40 tilts about the center of curvature 39C located on the opposed electrode 26, in such a manner that the slidable surface 40*a* and the guide surface 39*a* extend along a common plane. In other words, the securing surface 40*b* tilts about a tilt axis extending along direction Y.

When a signal that instructs tilting of the securing surface 40*b* is provided to the tilt motor MR, the tilt motor MR is rotated in a forward direction or a reverse direction by a predetermined number of rotations. This tilts the securing surface 40*b* of the tilt stage 40 about the center of curvature 39C.

In the illustrated embodiment, when the tilt stage 40 is oriented in such a manner that a normal direction of the securing surface 40*b* (hereinafter, referred to as an ejecting direction A) extends parallel with a normal direction of the opposed substrate 15 (direction Z), as indicated by the solid lines of FIG. 5, it is defined that the tilt stage 40 is located at an initial position. When the tilt stage 40 is oriented in such a manner that the ejecting direction A is tilted at a predetermined angle (a tilt angle θ) in direction X with respect to a normal line of the opposed substrate 15, as indicated by the two-dotted chain lines of FIG. 5, it is defined that the tilt stage 40 is located at a tilt position.

With reference to FIG. 4, a droplet ejection head (hereinafter, referred to simply as an ejection head) 41, which has a rectangular parallelepiped shape and extends in direction Y, is secured to the securing surface 40*b*. A nozzle plate 42 is formed on the lower side (the upper side as viewed in the drawing) of the ejection head 41. A nozzle forming surface 42*a*, or an ejection port forming surface extending parallel with the securing surface 40*b*, is formed on the side of the nozzle plate 42 facing the opposed substrate 15 (the upper side of the nozzle plate 42 as viewed in FIG. 4). A plurality of nozzles N, or ejection ports, are defined in the nozzle forming surface 42*a* and aligned at equal pitches along direction Y.

As shown in FIG. 5, each of the nozzles N extends through the nozzle plate 42 along a normal direction of the nozzle forming surface 42*a* (the securing surface 40*b*), or the ejecting direction A. The nozzles N are arranged in such a manner that, when the tilt stage 40 is held at the "initial position", the nozzles N are located forward from the center of curvature 39C in direction Z (rearward from the center of curvature 39C in the ejecting direction A). In the illustrated embodiment, positions located on the center of curvature 39C and forward from the nozzles N in the ejecting direction A are defined as droplet receiving positions PF.

As the tilt motor MR rotates in a forward direction, the tilt stage 40 moves from the "initial position" to the "tilt position". This pivots the nozzles N clockwise about the center of curvature 39C (the corresponding droplet receiving position PF) as the pivotal axis, as illustrated in FIG. 5. This inclines the extending direction of each of the nozzles N at the tilt angle θ in direction X with respect to a normal line of the opposed substrate 15 (direction Z). In this manner, each nozzle N maintains the corresponding droplet receiving position PF at a constant position and the distance between the nozzle N and the droplet receiving position PF at a predetermined distance (the traveling distance L), regardless of inclination of the extending direction of the nozzle N. The droplet ejection apparatus 30 is thus allowed to change the ejecting direction A, while maintaining reception accuracy of the droplets Fb, which are ejected from the nozzles N, by the opposed substrate 15.

Referring to FIG. 6, cavities 43, each of which communicates with the ink tank 38, are provided rearward from the nozzles N in the ejecting direction A. Each cavity 43 supplies the alignment film forming material F from the ink tank 38 to the corresponding one of the nozzles N. Oscillation plates 44 are bonded with the walls defining the cavities 43 at positions rearward from the cavities 43 in the ejecting direction A. Each of the oscillation plates 44 oscillates in the ejecting direction A and a direction opposite to the ejecting direction A. This increases and decreases the volume of the corresponding one of the cavities 43. A plurality of piezoelectric elements PZ are arranged on the oscillation plates 44 in correspondence with the nozzles N. Each of the piezoelectric elements PZ contracts and extends in response to a signal controlling actuation of the piezoelectric element PZ (a piezoelectric element drive signal COM: see FIG. 9, to the lower left). This oscillates the corresponding one of the oscillation plates 44 in the ejecting direction A and the direction opposite to the ejecting direction A.

As illustrated in FIG. 7, grid points (target positions P) at which the droplets Fb are received by the opposed electrode 26 are set in an area on the opposed electrode 26 (the opposed substrate 15) in which the alignment film 27 is to be formed. The grid points are spaced at regular intervals (the ejection pitches W) in direction X.

Subsequently, the tilt stage 40 is moved to the "tilt position" and transportation of the substrate stage 33 in direction X is started. The piezoelectric element drive signals COM are provided to the corresponding piezoelectric elements PZ in correspondence with the timing at which the droplet receiving positions PF reach the corresponding positions on the opposed electrode 26 at which the droplets Fb are received by the opposed electrode 26 (the corresponding target positions P).

This increases and decreases the volume of each of the cavities 43, oscillating the interface, which is meniscus, of the alignment film forming material F in each of the corresponding first nozzles N. Respondingly, as illustrated in FIG. 7, a predetermined weight of alignment film forming material F is ejected from the nozzles N as the droplets Fb, which has a predetermined diameter (droplet diameter R0: see FIG. 8) in correspondence with the piezoelectric element drive signals COM. Each of the droplets Fb then flies for a flying distance L in the direction defined by the corresponding one of the nozzles N, or the ejecting direction A, which is inclined by an inclination angle θ, at a predetermined ejection velocity Vf. The droplets Fb thus reach target positions P (droplet receiving positions P) on the opposed electrode 26.

In the illustrated embodiment, the piezoelectric element drive signals COM are generated based on the waveform data WD (see FIG. 9), which has been defined in advance through tests or the like. The piezoelectric element drive signals COM are set in such a manner as to smoothly oscillate meniscus to stably maintain the weight of each droplet Fb at a predetermined value. In other words, the droplet ejection apparatus 30 of the illustrated embodiment ejects the droplets Fb in response to the common piezoelectric element drive signals COM (the common waveform data WD). In this manner, the diameter of each droplet Fb is stably maintained at the droplet diameter R0.

After each droplet Fb has been received in the area corresponding to the target position P, the shape of the droplet Fb enlarges in direction X in correspondence with inclination of the ejecting direction A. For example, as the tilt angle θ is reduced, the shape of the droplet Fb that has been received by the opposed substrate 15 correspondingly becomes closer to a circular shape about the droplet receiving position PF, as viewed in direction Z. In contrast, if the tilt angle θ is increased, the shape of the droplet Fb on the opposed substrate 15 correspondingly becomes an oval shape extending in direction X, as viewed in direction Z.

Accordingly, the inventors of the present invention have found that, by approximating the shape of each droplet Fb after the droplet Fb is received by the opposed substrate 15 to an image of the droplet Fb projected in the ejecting direction A, the lower limit of the on-substrate size R1, which is the dimension of the received droplet Fb along direction X, that is, the dimension along direction X of the dot formed by the received droplet Fb is regulated.

Specifically, when the shape of each droplet Fb that has been received by the opposed substrate 15 is approximated to the projected image of the droplet Fb, the on-substrate size R1 of the droplet Fb is determined from the droplet diameter R0 and the tilt angle θ by the following equation:

$$R1=R0/\cos\theta$$

Further, since the ejecting direction A is inclined, a velocity component in direction X (a tangential velocity Vfx=Vf×sin θ: see FIG. 7) corresponding to the tilt angle θ is applied to each of the ejected droplets Fb. Also, since the opposed substrate 15 moves at the transport velocity Vx, the relative velocity corresponding to the transport velocity Vx is applied to each ejected droplet Fb in the direction opposite to direction X.

Therefore, in correspondence with the tangential velocity Vfx and the transport velocity Vx, each droplet Fb received by the opposed substrate 15 is shaped in such a manner that the on-substrate size R1 increases in direction X. In other words, the on-substrate size R1 of each droplet Fb is determined from the droplet diameter R0 and the tilt angle θ by the following formula:

$$R1>R0/\cos\theta$$

In the illustrated embodiment, in a step of ejecting the droplets Fb, the tilt angle θ is set in such a manner that the on-substrate size R1 of each droplet Fb becomes greater than or equal to the ejection pitch W. In this manner, the droplets Fb, which are arranged on the opposed substrate 15 along direction X are reliably joined together.

In the droplet ejection apparatus 30 of the illustrated embodiment, the tilt angle θ is set from the droplet diameter R0 and the ejection pitch W to satisfy the following formula: θ=arccos (R0/W). However, the tilt angle θ may be set to satisfy the following formula: arccos (R0/W)≦θ<90.

The electric configuration of the droplet ejection apparatus 30, which is constructed as above-described, will be explained with reference to FIG. 9.

Figure 9:
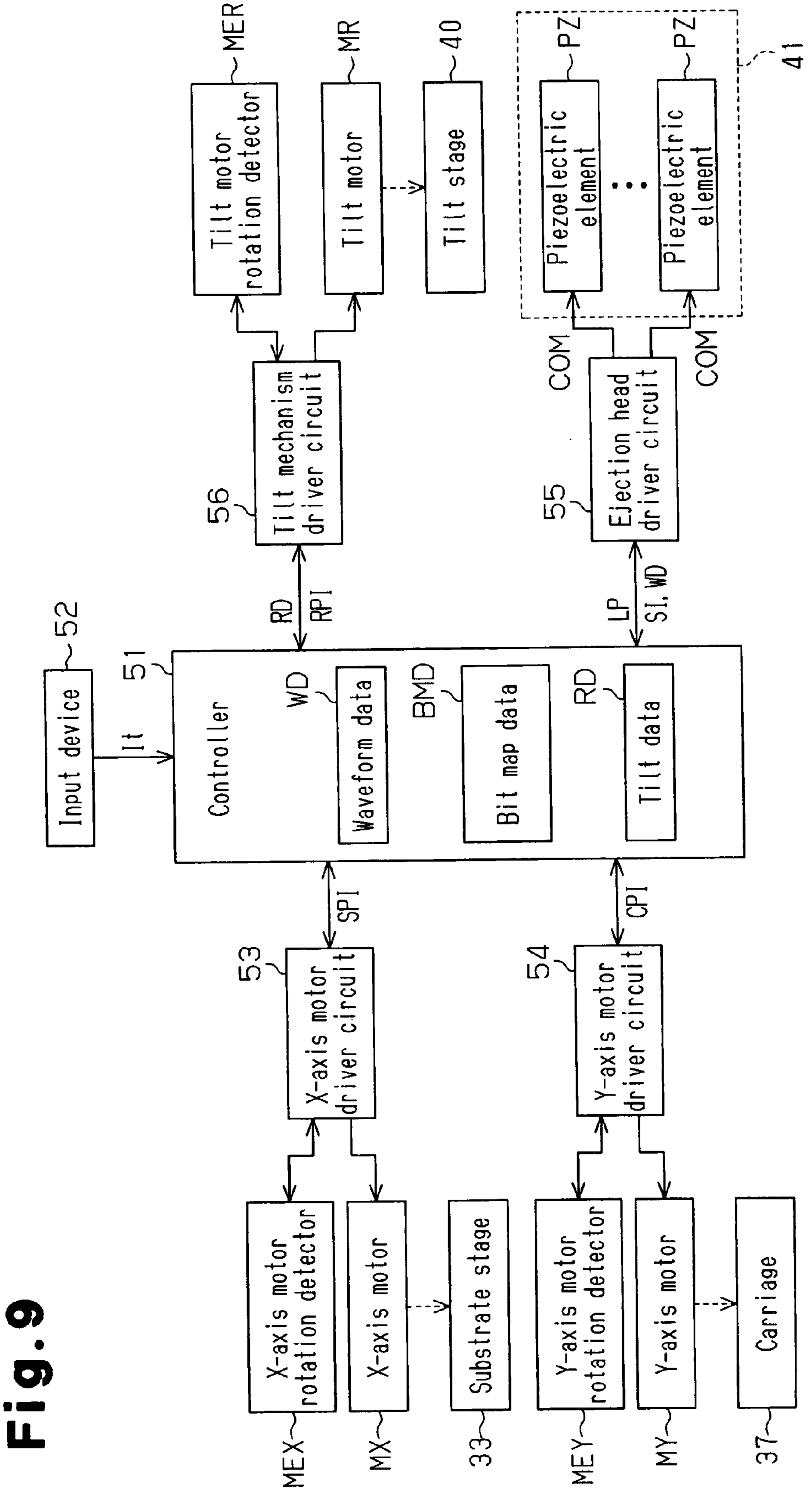
FIG. 9 is a block diagram representing the electric configuration of the droplet ejection apparatus of FIG. 3.

As illustrated in FIG. 9, a controller 51, which forms an angle setting section, includes a CPU forming a tilt information generating section and a control section, and a RAM, and a ROM. In accordance with various types of data and programs stored in the RAM or the ROM, the controller 51 moves the substrate stage 33 and the carriage 37, while controlling actuation of the piezoelectric elements PZ of the ejection head 41.

An input device 52, an X-axis motor driver circuit 53, a Y-axis motor driver circuit 54, an ejection head driver circuit 55, and a tilt mechanism driver circuit 56 are connected to the controller 51.

The input device 52 has manipulation switches such as a start switch and a stop switch, and sends different manipulation signals to the controller 51. The input device 52 also provides information regarding the target thickness of the alignment film 27 to be formed on the opposed substrate 15 to the controller 51 as a prescribed form of film thickness information It.

The thickness information It is then input to the controller 51 through the input device 52. In accordance with the thickness information It, the controller 51 calculates the total weight of the alignment film forming material F to be ejected onto the opposed electrode 26. Further, based on the obtained total weight of the alignment film forming material F and the weight of each droplet Fb determined in correspondence with the waveform data WD, the controller 51 calculates the ejection pitch W (the position coordinates of each of the target positions P). Subsequently, the controller 51 generates and stores the bit map data BMD for ejection of the droplets Fb and the tilt data RD in correspondence with the ejection pitch W.

The bit map data BMD associates the bit values (0 or 1) with each of the target positions P on the opposed electrode 26. In correspondence with each of the bit values, the bit map data BMD indicates whether to turn on or off the corresponding one of the piezoelectric elements PZ. Specifically, the bit map data BMD is defined in such a manner that the droplets Fb are ejected each time the droplet receiving positions PF reach the corresponding target positions P.

The tilt data RD associates the tilt angle θd with the number of rotations of the tilt motor MR.

The tilt angle θ is set using the droplet diameter R0 corresponding to the waveform data WD in such a manner as to satisfy the following equation: θ=arccos (R0/W).

The X-axis motor driver circuit 53 receives a corresponding drive signal from the controller 51 and, in response to the signal, drives the X-axis motor MX to rotate in a forward or reverse direction. A rotation detector MEX is connected to the X-axis motor MX and sends a detection signal to the X-axis motor driver circuit 53. In correspondence with the detection signal, the X-axis motor driver circuit 53 calculates the movement direction and the movement amount of the substrate stage 33 (the opposed substrate 15) and generates information representing the current position of the substrate stage 33 as substrate position information SPI. The controller 51 receives the substrate position information SPI from the X-axis motor driver circuit 53 and outputs various types of signals.

The Y-axis motor driver circuit 54 receives a corresponding drive signal from the controller 51 and, in response to the signal, drives the Y-axis motor MX to rotate in a forward or reverse direction. A rotation detector MEY is connected to the Y-axis motor MY and provides a detection signal to the Y-axis motor driver circuit 54. In correspondence with the detection signal, the Y-axis motor driver circuit 54 calculates the movement direction and the movement amount of the carriage 37 (the head unit 30) and generates information representing the current position of the carriage 37 as carriage position information CPI. The controller 51 receives the carriage position information CPI from the Y-axis motor driver circuit 54 and outputs various types of drive signals.

Specifically, before the opposed substrate 15 reaches the position immediately below the carriage 37, the controller 51 generates ejection control signals SI, which is synchronized with a prescribed clock signal, with reference to the bit map data BMD corresponding to a (forward or reverse) scanning cycle and in correspondence with the stage position information SPI and the carriage position information CPI. The controller 51 serially transfers the generated ejection control signals SI to the ejection head driver circuit 55 each time scanning by the carriage 37 is performed.

Further, each time the droplet receiving positions PF reach the corresponding target positions P, the controller 51 generates signals (ejection timing signals LP) instructing output of the piezoelectric element drive signals COM, which are produced referring to the waveform data WD, to the piezoelectric elements PZ, in correspondence with the stage position information SPI. The generated ejection timing signals LP are serially transferred to the ejection head driver circuit 55 by the controller 51.

The ejection head 41 is connected to the ejection head driver circuit 55. The controller 51 provides the waveform data WD, the ejection control signals SI, and the ejection timing signals LP to the head driver circuit 55. In response to the ejection control signals SI, the ejection head driver circuit 55 sequentially converts the ejection control signals SI from serial forms into parallel forms in correspondence with the piezoelectric elements PZ. Each time the controller 51 inputs the ejection timing signals LP to the ejection head driver circuit 55, the ejection head driver circuit 55 provides the piezoelectric element drive signals COM based on the waveform data WD to the piezoelectric elements PZ in correspondence with the ejection control signals SI, which have been converted into the parallel forms. In other words, each time the droplet receiving positions PF reach the target positions P, the ejection head driver circuit 55 provides the piezoelectric element drive signals COM to the corresponding piezoelectric elements PZ.

In response to reception of the tilt data RD from the controller 51, the tilt mechanism driver circuit 56 drives the tilt motor MR, which tilts the tilt stage 40, to rotate in a forward direction or a reverse direction. A tilt motor rotation detector MER is connected to the tilt mechanism driver circuit 56 and inputs a detection signal to the tilt mechanism driver circuit 56. In correspondence with the detection signal, the tilt mechanism driver circuit 56 calculates the tilt angle θ (the actual tilt angle) of the tilt stage 40. Further, the tilt mechanism driver circuit 56 generates information regarding the obtained actual tilt angle as tilt stage information RPI and sends the information to the controller 51.

A method for forming the alignment film 27 on the opposed substrate 15 using the droplet ejection apparatus 30, which has been described so far, will hereafter be explained.

First, as illustrated in FIG. 3, the opposed substrate 15 is mounted on the substrate stage 33. Specifically, at this stage, the substrate stage 33 is located rearward from the carriage 37 in direction X. The carriage 37 is arranged at the rearmost position of the guide member 35 in direction Y. The tilt stage 40 is held at the "initial position".

In this state, the film thickness information It is input to the controller 51 by manipulating the input device 52. The controller 51 generates the bit map data BMD and the tilt data RD based on the thickness information It and stores the data.

Then, the controller 51 provides the tilt data RD to the tilt mechanism driver circuit 56 and moves the tilt stage 40 to the "tilt position". Subsequently, the controller 51 receives the tilt stage information RPI from the tilt mechanism driver circuit 56 and determines whether the actual tilt angle is the tilt angle θ corresponding to the tilt data RD. In other words, the controller 51 determines whether the actual tilt angle is the tilt angle θ that satisfies the equation: θ=arcos (R0/W).

If the controller 51 determines that the actual tilt angle is the tilt angle θ corresponding to the tilt data RD (after the controller 51 sets the tilt stage 40), the controller 51 operates the Y-axis motor MY to move the carriage 37. The controller 51 thus sets the carriage 37 (the nozzles N) in such a manner that, when the opposed substrate 15 is transported in direction X, the droplet receiving positions PF are located on the scanning paths of the corresponding target positions P (extending in direction X). The controller 51 then actuates the X-axis motor MX to start transportation of the substrate stage 33 (the opposed substrate 15) in direction X.

At this stage, the controller 51 outputs the waveform data WD to the ejection head driver circuit 55 synchronously with a prescribed clock signal. Further, the controller 51 generates the ejection control signals SI each by synchronizing the bit map data BMD corresponding to a single scanning cycle of the substrate stage 33 with a prescribed clock signal. The controller 51 serially transfers the generated ejection control signals SI to the ejection head driver circuit 55.

Afterwards, each time the droplet receiving positions PF reach the corresponding grid points on the opposed electrode 26, the controller 51 outputs the ejection timing signals LP in accordance with the stage position information SPI and the carriage position information CPI. In this manner, ejection of the droplets is performed in correspondence with the ejection control signals SI.

In other words, the controller 51 provides the piezoelectric element drive signals COM corresponding to the waveform data WD to the piezoelectric elements PZ in correspondence with the timing at which the droplet receiving positions PF reach the target positions P. The nozzles N are thus caused to simultaneously eject the droplets Fb of the alignment film forming material F.

The ejected droplets Fb then travel in the ejecting direction A, which is inclined at the tilt angle θ, and sequentially reach the areas corresponding to the target positions P spaced at the ejection pitch W in direction X. Specifically, the ejecting direction A of the droplets Fb is inclined at the tilt angle θ, which achieves the aforementioned approximation of the shapes of the droplets Fb on the opposed substrate 15. The on-substrate size R1 of each droplet Fb thus becomes greater than or equal to the ejection pitch W. Further, the relative velocity corresponding to the tangential velocity Vfx and the transport velocity Vx further increases the on-substrate size R1 of each droplet Fb received by the opposed substrate 15. The droplets Fb on the opposed electrode 26 are thus reliably joined together along direction X.

Such joining of the droplets Fb forms a liquid film having uniform thickness. The liquid film is then dried to form the alignment film 27 having uniform thickness. After the alignment film 27 is provided on the opposed substrate 15, the alignment film 27 is subjected to a known rubbing process.

Further, by a method similar to the above-described method, the alignment film 24 is deposited on the element substrate 14 using the droplet ejection apparatus 30. The alignment film 24 is then subjected to rubbing, as in the case of the alignment film 27. Subsequently, the seal material 16 is provided on the element substrate 14 and the liquid crystal 17 is arranged in the space encompassed by the seal material 16. The element substrate 14 and the opposed substrate 15 are then bonded together to complete the liquid crystal panel 13.

The illustrated embodiment has the following advantages.

(1) In the illustrated embodiment, the tilt angle θ defined by the normal line of the opposed substrate 15 and the ejecting direction A is set in accordance with the droplet diameter R0 of each ejected droplet Fb and the ejection pitch W of the droplets Fb, in such a manner that the on-substrate size R1 of each droplet Fb becomes greater than or equal to the ejection pitch W of the droplets Fb.

Therefore, the droplets Fb are reliably joined together on the opposed substrate 15 in a direction corresponding to the ejecting direction A. As a result, regardless of change of the ejection pitch W, or the target thickness of the alignment film 27, the droplets Fb arranged on the opposed substrate 15 along direction X are joined together. This improves uniformity of the thickness of the alignment film 27 formed by the droplets Fb.

(2) In the illustrated embodiment, the on-substrate size R1 of each droplet Fb is set in such a manner that the on-substrate size R1 is approximated to that of the image of the droplet Fb projected in the ejecting direction A. The tilt angle θ defined by the ejecting direction A and the normal line of the opposed substrate 15 is set solely in correspondence with the droplet diameter R0 and the ejection pitch W.

Therefore, the droplets Fb arranged on the opposed substrate 15 along direction X are further easily joined together.

(3) In the illustrated embodiment, the ejecting direction A is inclined relative to a normal line of the opposed substrate 15 in such manner as to coincide with the scanning direction of the opposed substrate 15 (direction X). This increases the on-substrate size R1 of each droplet Fb in correspondence with the transport velocity Vx of the opposed substrate 15. As a result, uniformity of the thickness of the alignment film 27 is further reliably enhanced.

(4) In the illustrated embodiment, the controller 51 generates the tilt data RD regarding the tilt angle θ based on the droplet diameter R0 of each droplet Fb and the ejection pitch W of the droplets Fb. The controller 51 then operates the tilt motor MR with reference to the tilt data RD in such a manner that the tilt angle θ satisfies the equation: θ=arccos (R0/W). Thus, the droplets Fb arranged on the substrate 15 along direction X are further reliably joined together.

The illustrated embodiment may be modified in the following forms.

In the illustrated embodiment, the tilt angle θ is set solely in correspondence with the droplet diameter R0 of each droplet Fb and the ejection pitch W of the droplets Fb. However, setting of the tilt angle θ may be performed in correspondence with the surface tension or viscosity or ejection velocity Vf of each droplet Fb in addition to the droplet diameter R0 and the ejection pitch W. That is, the tilt angle θ may be set in any suitable manner as long as the tilt angle θ is set in correspondence with at least the droplet diameter R0 of each droplet Fb and the ejection pitch W of the droplets Fb.

In the illustrated embodiment, the substrate stage 33 is moved in a direction opposite to the ejecting direction A, as viewed in the normal direction of the opposed substrate 15. That is, the substrate stage 33 is scanned along direction X, which coincides with a direction along which the ejecting direction A is inclined with respect to a normal line of the opposed substrate 15. However, the substrate stage 33 may be transported in the ejecting direction A, as viewed in the normal direction of the opposed substrate 15. That is, the substrate stage 33 may be scanned a direction opposite to direction X, or a direction opposite to the direction along which the ejecting direction A is inclined with respect to a normal line of the opposed substrate 15. In this case, the tilt angle θ may be set in correspondence with the transport velocity Vx of the substrate stage 33, in addition to the droplet diameter R0 and the ejection pitch W of the droplets Fb. That is, setting of the tilt angle θ may be achieved in any suitable manner as long as such setting is performed in correspondence with at least the droplet diameter R0 of each droplet Fb and the ejection pitch W of the droplets Fb in such a manner that the on-substrate size R1 of each droplet Fb becomes greater than or equal to the ejection pitch W.

In the illustrated embodiment, the tilt mechanism is embodied by the tilt stage 40. However, the substrate stage 33, for example, may be embodied as the tilt mechanism. In this case, the opposed substrate 15 mounted on the substrate stage 33 is tilted with respect to the nozzle forming surface 42*a*.

Although the single row of nozzles N is provided in the illustrated embodiment, multiple rows of nozzles N may be employed.

In the illustrated embodiment, the deposit is embodied as the alignment film 27 of the liquid crystal display 10. However, for example, different types of thin films, metal wirings, or color filters of the liquid crystal display 10 or other types of displays may be formed as the deposit. The displays other than the liquid crystal display 10 include, for example, displays having a field effect type device (an FED or an SED). The field effect type device emits light from a fluorescent substance by radiating electrons released by an electron release element onto the fluorescent substance. That is, any suitable deposit may be formed according to the present invention, as long as the deposit is formed by ejected droplets Fb of liquid.

Although the substrate is embodied as the opposed substrate 15 of the liquid crystal display 10, a silicone substrate or a flexible substrate or a metal substrate may be provided as the substrate.

Although the electro-optic device is embodied as the liquid crystal display 10, an electroluminescence device, for example, may be formed as the electro-optic device.

What is claimed is:

1. A deposit forming method comprising:

ejecting droplets of a deposit forming material onto a substrate from a plurality of ejection ports formed in an ejection port forming surface, thereby forming a deposit by the droplets on the substrate, wherein the droplets are ejected along a direction inclined at a predetermined angle in a predetermined direction with respect to a normal line of the substrate and at a predetermined pitch in the predetermined direction; and moving the substrate relative to the ejection port forming surface in the predetermined direction when the droplets are ejected onto the substrate, wherein by pivoting the ejection port forming surface about a droplet receiving position located on the substrate, the predetermined angle is set in correspondence with the diameter of each of the droplets and the predetermined pitch in such a manner that the dimension of a dot formed by each droplet on the substrate in the predetermined direction becomes greater than or equal to the predetermined pitch.

2. The method according to claim 1, wherein the predetermined angle is set in such a manner as to satisfy the formula: $\arccos(R/W) \leqq \theta < 90$ in which R, W, and $\theta$ represent the diameter of each droplet, the predetermined pitch, and the predetermined angle, respectively.

3. The method according to claim 1, wherein the deposit formed on the substrate is an alignment film.

* * * * *